United States Patent [19]

Karas et al.

[11] Patent Number: 5,286,530
[45] Date of Patent: Feb. 15, 1994

[54] METHOD FOR PROVIDING ADHERENT METAL COATINGS ON CYANATE ESTER POLYMER SURFACES

[75] Inventors: Bradley R. Karas, Amsterdam; Herbert S. Chao, Schenectady, both of N.Y.

[73] Assignee: General Electric Company, East Windsor, N.J.

[21] Appl. No.: 3,916

[22] Filed: Jan. 13, 1993

[51] Int. Cl.$^5$ .............................................. B05D 1/00
[52] U.S. Cl. .................................. 427/437; 427/306; 427/438; 427/443.1
[58] Field of Search ...................... 427/437, 438, 443.1, 427/306

[56] References Cited

U.S. PATENT DOCUMENTS

| | | | |
|---|---|---|---|
| 4,157,360 | 6/1979 | Prevorsek | 528/193 |
| 4,217,438 | 8/1980 | Brunelle | 528/196 |
| 4,335,164 | 6/1982 | Dillard | 427/306 |
| 4,396,679 | 8/1983 | Gaku et al. | 428/451 |
| 4,629,636 | 12/1986 | Courduvelis | 427/306 |
| 4,764,327 | 8/1988 | Nozaki | 264/227 |
| 5,076,864 | 12/1991 | Tanaka | 427/97 |

*Primary Examiner*—Shrive Beck
*Assistant Examiner*—Vi Duong Dang
*Attorney, Agent, or Firm*—W. H. Pittman; C. A. Berard; S. A. Young

[57] ABSTRACT

Cyanate ester polymer articles, particularly fiber-reinforced, are metallized by electroless deposition preceded by a series of pretreatment steps which improve adhesion of the metal layer or layers. Said steps include aqueous alkali followed by nitric acid treatment. They preferably also include an initial alkaline permanganate treatment, preferably preceded by aqueous alkali.

20 Claims, No Drawings

METHOD FOR PROVIDING ADHERENT METAL COATINGS ON CYANATE ESTER POLYMER SURFACES

This invention relates to the metallization of plastic surfaces, and more particularly to a metallization method useful with articles fabricated from cyanate ester polymers.

Metallized plastics have become of interest in recent years as a replacement for metal in such articles as enclosures for electrical appliances, microwave ovens and business machines. When fabricated of plastics alone, such enclosures are inadequate to shield internal parts from external radiation sources such as electromagnetic interference, particularly radio frequency interference, and static electricity, and also to prevent escape of internally generated radiation. Such sources of interference can be blocked out by providing a metal coating such as nickel on the surface of the plastic substrate, typically by electroless or electrolytic deposition. Metallization is also desirable for the formation of printed circuit boards, whereupon the entire surface or a portion thereof is metallized by additive, semi-additive or subtractive methods known in the art.

Metallized plastics also have potential for use in electrical components for telecommunication systems, including waveguides and multiplexers. For such use, the thickness of the metal coating will vary with the frequency of operation of the system. Typical thicknesses are up to about 3–5 micron for Ku-band and about 6–8 microns for C-band signals.

Plastic metallization may be achieved by various processes including electrodeposition, electroless deposition, chemical vapor and physical vapor deposition. Electroless deposition of metals such as nickel is often advantageous, particularly when followed by other deposition methods. A typical electroless deposition bath is a solution comprising a nickel salt, a reducing agent therefor such as a hypophosphite, a borohydride or hydrazine, and various additives.

A problem which arises in the metallization of plastics, especially by electroless methods, is the lack of adhesion of the metal layer to the substrate. Adhesion may be measured by a cross-hatch tape test, described in detail hereinafter.

Among the polymers which have been proposed for metallization, particularly for use in telecommunication systems and the like, are cyanate ester polymers. They are widely used in printed circuit boards by reason of their dielectric properties, high temperature resistance and low water absorption. They are similar to other resins, however, in that they typically exhibit poor adhesion to metal coatings.

The present invention provides a method of improving the adhesion of metal layers, particularly those deposited at least in part by electroless deposition, to cyanate ester surfaces. Said method may involve both mechanical and chemical interactions with the substrate surface, although interaction by only one of these means may be employed under certain circumstances.

In one of its aspects, the invention is a method for depositing an adherent metal layer on the surface of a resinous substrate comprising a polymeric cyanate ester, said method comprising the steps of:

contacting at least a portion of said surface with an aqueous alkali metal hydroxide solution having a concentration in the range of about 4–15 M, contacting said surface with nitric acid of at least about 50% concentration by weight, depositing an electroless metal layer on said surface, and heat treating the metal-coated surface at a temperature in the range of about 100°–150° C. for at least about 30 minutes.

The cyanate ester polymers, also sometimes referred to as polycyanurates, employed according to the present invention are thermosetting or thermoset polymers comprising structural units of the formula

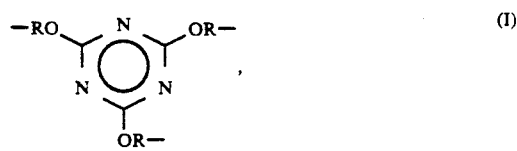

wherein each R is a divalent organic radical attached through oxygen to the triazine rings. As will be apparent from formula I, they are highly crosslinked. They are typically prepared by the cyclotrimerization of a dicyanate of the formula NCO-R-OCN to form a trimer prepolymer, followed by thermal crosslinking. Such polymers are described, for example, in U.S. Pat. No. 4,157,360 and McConnell, Advanced Composites, May/June 1992, 28–37, the disclosures of which are incorporated by reference herein.

The R values in formula I may be different but are usually the same. Suitable R values include m-phenylene, p-phenylene, 4,4'-biphenylene, 2,2-bis(4-phenylene)propane and similar radicals such as those which correspond to the aromatic dihydroxy compounds disclosed by name or formula (generic or specific) in U.S. Pat. No. 4,217,438, the disclosure of which is incorporated by reference herein. Also included are radicals containing non-hydrocarbon moieties. These may be substituents such as chloro, nitro, alkoxy and the like, and also linking radicals such as thio, sulfoxy, sulfone, ester, amide, ether and carbonyl. Most often, however, all R radicals are hydrocarbon radicals.

The R radicals preferably have the formula

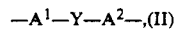

wherein each of $A^1$ and $A^2$ is a monocyclic divalent aromatic radical and Y is a bridging radical in which one or two atoms separate $A^1$ from $A^2$. The free valence bonds in formula II are usually in the meta or para positions of $A^1$ and $A^2$ in relation to Y.

The $A^1$ and $A^2$ values may be unsubstituted phenylene or substituted derivatives thereof, illustrative substituents (one or more) being alkyl, alkenyl, halo (especially chloro and/or bromo), nitro, alkoxy and the like. Unsubstituted phenylene radicals are preferred. Both $A^1$ and $A^2$ are preferably p-phenylene, although both may be o- or m-phenylene or one o- or m-phenylene and the other p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, 2-[2.2.1]-bicycloheptylmethylene, ethylene, isopropylidene, neopentylidene, cyclohexylidene, cyclopentadecylidene, cyclododecylidene or adamantylidene, especially a gem-alkylene (alkylidene) radical. For reasons of availability and particular suitability for the purposes of this invention, the preferred radical of formula II is the 2,2-bis(4-phenylene)propane radical, which is derived from bisphenol A and in which Y is isopropylidene and $A^1$ and $A^2$ are each p-phenylene.

Numerous cyanate ester polymers suitable for use in the invention are commercially available. They include those sold under the trade designations "Amoco 1939-3", "Amoco 1999-3", Fiberite 954-3"and "YLA RS-3". The first two are manufactured by Amoco Chemicals, the third by ICI, and the fourth by YLA Inc. These materials differ in ways which are not always readily apparent by reason of their proprietary nature. For that reason, variation of the details of the method of the invention may be necessary as noted hereinafter.

The cyanate ester polymer is generally reinforced. Fibrous reinforcing agents such as carbon, glass, steel, boron nitride or highly oriented polyamide fibers are most often employed, with carbon fibers often being preferred. It is, however, within the scope of the invention to employ other reinforcing materials such as particulate fillers or woven cloth. It is also within the scope of the invention to employ non-reinforced cyanate ester, or reinforced cyanate ester with a surface layer of non-reinforced material.

Prior to the method of this invention, it is frequently preferred to clean the surface of the substrate with a degreasing agent, typically a halohydrocarbon such as 1,1,2-trichlorotrifluoroethane, or with a conventional detergent.

In the first step of the method of this invention as described hereinabove, the surface of the cyanate ester polymer substrate (or a desired portion thereof, as is true of all the steps of the method) is contacted with an aqueous alkali metal hydroxide solution (hereinafter sometimes "alkali solution" or "second alkali solution" for reasons which will become apparent hereinafter). Sodium hydroxide and potassium hydroxide are preferred by reason of their availability and particular suitability. Said solution has a concentration in the range of about 4–15M, preferably about 10–13M. Typical contact temperatures and times are in the range of about 50°–90° C. and about 1–4 minutes.

The next step is contact of the substrate with nitric acid. The concentration of said nitric acid is at least about 50% and typically up to about 70% by weight. Typical contact conditions are ambient temperature (i.e., about 20°–30° C.) and about 1–5 minutes.

It is believed that the effect of the nitric acid is to react chemically with the cyanate ester polymer, providing nitro and/or nitrate groups thereon. For this purpose, a relatively mild nitric acid treatment, provided according to the invention by contact with nitric acid alone, is required. Severe nitration procedures, as illustrated by the use of a mixture of nitric and sulfuric acids, is too severe for employment according to the present invention since it causes cleavage of the triazine rings in the cyanate ester polymer.

For certain cyanate esters, alkali metal hydroxide treatment followed by nitric acid treatment is adequate to produce excellent metal adhesion. It may not, however, be adequate with all such polymers. Accordingly, in a strongly preferred embodiment of the invention the above-described alkali metal hydroxide treatment is preceded by a step of contacting the substrate surface, or at least a portion thereof, with an aqueous solution of alkali metal permanganate and alkali metal hydroxide (hereinafter sometimes "alkaline permanganate solution") in concentrations of about 0.4–2.0M and about 0.5–4.0M, respectively.

As with the second alkali solution, the preferred alkali metal compounds employed in the alkaline permanganate solution are those of sodium and potassium. The preferred concentrations of permanganate and hydroxide are about 0.75–1.25M and about 1–2M, respectively. Temperatures and times of treatment are generally in the range of about 50°–90° C. and about 2–15 minutes, respectively.

It is believed that treatment with the alkaline permanganate solution provides the mechanical component of the adhesion improvement afforded by the method of the invention, said component comprising etching of the substrate to form a roughened surface thereof. While said treatment may sometimes be employed alone prior to the second alkali treatment, metal adhesion in some instances is further improved by employing a first alkali metal hydroxide (hereinafter sometimes simply "first alkali") solution treatment, similar to the one previously described, immediately prior to contact with said alkaline permanganate solution.

Treatment with the alkaline permanganate solution is usually followed by removal of manganese residues on the substrate by contact with a suitable reducing agent, typically in the form of an aqueous solution. Solutions of hydroxylamine salts are particularly useful for this purpose; they are commercially available under such tradenames as "Shipley Circuposit ® MLB 216".

In its most limited aspect, therefore, the present invention comprises the following steps, more fully described hereinabove, for treatment of the cyanate ester polymer substrate: contact with the first alkali solution, with the alkaline permanganate solution, with a reducing agent, with the second alkali solution and finally with nitric acid. After each step, a water rinse is normally employed. Moreover, a drying step may be employed after treatment with the second alkali solution in order to avoid neutralization and/or dilution of the nitric acid.

Following these treatment steps, the substrate is subjected to electroless metal deposition, typically by conventional methods involving art-recognized, commercially available reagents. Such methods generally begin with a pretreatment to aid in the absorption of the electroless deposition catalyst, typically with a reagent such as Shipley Cleaner-Conditioner 1175A which is an alkaline solution containing organic compounds. This may be followed by surface activation employing, for example, Shipley Cataprep ® 404 containing sodium bisulfate and various surfactants; and then by treatment with an acidic palladium-containing solution as catalyst, illustrated by Shipley Cataposit ® 44 which comprises tin and palladium compounds, the palladium being the principal catalytic species.

After a water rinse, the substrate may be immersed in a solution of Shipley Cuposit ® Accelerator 19, a fluoboric acid-containing formulation used to remove tin, or an equivalent thereof. It may then be further rinsed with water and treated with one or more electroless plating solutions.

Electroless plating baths are well known in the art and are generally described, for example, in Kirk-Othmer, Encyclopedia of Chemical Technology, Third Edition, Volume 8, the contents of which are incorporated herein by reference. The selection of a particular electroless plating bath or process is not critical to the invention. The contents of the bath and the plating parameters such as temperature, pH and immersion time will of course depend on the metal to be deposited.

Suitable plating baths include Shipley Cuposit ® 250 and 251 and Enthone Enplate ® CU-406 and NI-426, the first three being electroless copper and the fourth electroless nickel plating solutions. When nickel is the first metal deposited, it is often found that optimum adhesion to the substrate is provided when the nickel layer is at least about 0.5 micron thick.

Following electroless plating, the metallized substrate is heat treated at a temperature of about 100°-150° C. for at least about 30 minutes, preferably about 45-90 minutes. This heat treatment operation is an essential feature of the invention, responsible in part for the improved adhesion of the metal layer to the substrate.

Articles comprising cyanate ester substrates which have been metallized by the above-described method are another aspect of the invention. Said articles may additionally comprise at least one further metal layer deposited on said electroless layer. Typical further metal layers are electrolytic copper followed by electroless or electrolytic nickel, and electrolytic silver which may be preceded by electrolytic copper and an electroless or electrolytic nickel barrier layer.

The aforementioned additional metal layer or layers may be deposited by conventional electrolytic and/or electroless methods. Following electrolytic deposition if employed, the metallized substrate is typically heat treated for at least about 5 hours at a temperature in the range of about 100°-150° C., preferably about 125°-140° C.

The articles of this invention have substantially improved adhesion of the metal to the resin surface, in comparison with untreated substrates. This is shown by the results of a cross-hatch tape test adapted from ASTM procedure D3359. In the adaptation, a tool is used to score the metal surface with a series of perpendicular lines to form a grid. A piece of pressure-sensitive tape ("Permacel 610" of 3M Co.) is adhered to the metal surface over the grid and is sharply removed by pulling at approximately 90°. The grid area is then visually inspected for removal of the metal layer and evaluated on a scale of 0-5, with 5 designating essentially no metal removed and 0 designating a large amount of metal removed.

The invention is illustrated by the following examples.

EXAMPLE 1

The substrate employed was a sample of "Amoco 1939-3" cyanate ester reinforced with graphite fibers. It was cleaned with a commercially available detergent (2% by volume aqueous solution) at 50° C. for 5 minutes, rinsed with aerated water for 2 minutes, contacted with 12M aqueous potassium hydroxide solution at 75° C. for 3 minutes, dried, treated with concentrated nitric acid for 2 minutes and again rinsed. It was then coated with an electroless nickel layer by the following scheme of operations, all rinses being with non-aerated water:
Shipley Cleaner-Conditioner 1175A, 75° C., 5 minutes;
Rinse, 2 minutes;
Shipley Cataprep 404, 270 g/l, 1 minute;
Shipley Cataposit 44, 1.5% by volume, with Cataprep 404 at 270 g/l, 44° C., 3 minutes;
Rinse, 2 minutes;
Shipley Accelerator 19, 16% by volume, 3 minutes;
Rinse, 2 minutes;
Enthone Enplate ® NI-426, 53° C., pH 6.2, 9 minutes;
Rinse, 2 minutes;
Dry;
Heat treat at 110° C., 1 hour.

One side of the test sample was coated with platers' tape and a layer of copper was deposited by electrolysis for 10 minutes at 32 milliamps/cm.$^2$ in an aqueous solution of 140 g/l of cupric sulfate pentahydrate, 50 g/l of sulfuric acid and 175 ppm. of chloride ion. Finally, the sample was rinsed with aerated water for 2 minutes, dried and heat treated at 135° C. for 8 hours.

After each heat treatment step, the sample passed the adhesion test with a rating of 5. The thickness of the copper layer was about 7.5 microns, more than sufficient for both C- and Ku-band applications.

The same metallization procedure was employed with samples of carbon fiber-reinforced "fiberite 954-3" and "YLA RS-3" cyanate ester polymers. Both failed the adhesion test, with ratings of 0.

EXAMPLE 2

The substrates employed were samples of "Amoco 1939-3", "Fiberite 954-3" and "YLA RS-3" cyanate esters reinforced with graphite fibers. They were cleaned with the detergent of Example 1 at 50° C. for 5 minutes, rinsed with aerated water for 2 minutes and subjected to the following treatments, each treatment being followed by a 2-minute rinse with aerated water:
12M aqueous potassium hydroxide solution, 75° C., 3 minutes;
1.06M aqueous sodium permanganate/1.5M sodium hydroxide solution, 75° C., 5 minutes;
"Shipley Circuiposit ® MLB 216", 52° C., 5 minutes;
12M aqueous potassium hydroxide solution, 75° C., 3 minutes.

Following the final potassium hydroxide treatment and rinse, the substrates were dried, treated with concentrated nitric acid for 2 minutes and again rinsed. They were then coated with an electroless nickel and an electrolytic copper layer, dried and heat treated as described in Example 1. After each heat treatment step, each sample passed the adhesion test with a rating of 5.

Similar results were obtained on all samples with omission of the platers' tape, resulting in metallization of both sides of the sample; and on the "Amoco 1939-3" sample with treatment with sodium or potassium permaganate/hydroxide solutions of the same concentration for 5 or 15 minutes, and with heat treatment after application of the electrolytic copper for 8 hours at 135° C. or 1 hour at 175° C.

EXAMPLE 3

Samples prepared in accordance with Example 2 were overplated, after electrolytic plating and the second heat treatment step, with about 0.5 micron of electroless nickel by immersion in a 0.1% (by weight) solution of palladium(II) chloride containing 1% by volume hydrochloric acid for about 1 minute followed by treatment with Enthone Enplate Ni-426 solution at 53° C. for 7 minutes. The overplated samples were stored under high temperature/humidity conditions (65° C., 100% relative humidity) for 65 hours, after which they were exposed to ambient conditions for 2-5 minutes. All samples passed the adhesion test.

EXAMPLE 4

The procedure of Example 2 was repeated, except that the electrolytic copper treatment was replaced with electrolytic silver, employing a Technic Silversene solution with an initial layer deposited from a strike bath at 11 milliamps/cm.$^2$ for 1 minute followed by treatment at 5 milliamps/cm.$^2$ for 9 minutes (Ku-band applications, about 4.25 microns) or 20 minutes (C-band frequencies, about 6.25 microns). After the final heat treatment, improved adhesion was noted for all samples but the adhesion to the "Fiberite 954-3" sample was superior.

The samples were exposed to the high temperature/humidity conditions of Example 2 for 95 hours, followed by 30 minutes at ambient conditions. No change in adhesion rating was noted.

In a second series of tests, samples similarly treated were exposed to five cycles in the presence of water at 0.84 kg./cm.$^2$ for 30 minutes at ambient conditions. Similarly, no change in adhesion was noted.

EXAMPLE 5

The procedure of Example 2 was repeated, except that the treatment steps with the second alkali solution and nitric acid were omitted. All three samples failed the adhesion test, with ratings of 0.

EXAMPLE 6

The procedure of Example 2 was repeated, except that treatment with the first alkaline solution was omitted. The "Amoco 1939-3" sample passed the adhesion test with a rating of 5; the other two samples failed with a rating of 0.

EXAMPLE 7

The procedure of Example 4 was repeated, using an "Amoco 1999-3" sample. The sample passed the adhesion test with a rating of 5.

Samples thus treated were subjected to five cycles at 135° C. for 15 minutes followed by −196° C. (the temperature of liquid nitrogen) for 15 minutes, with a maximum transfer time of 20 seconds. Adhesion remained substantially the same. This was also true for five cycles in the presence of water at 0.84 kg./cm.$^2$ for 30 minutes followed by equal periods at ambient pressure, and for 144 hours under the high temperature/humidity conditions of Example 2.

Other variations of the procedure of this example included employment of other grades of graphite fibers; application of a fiber-free resin layer to the surface of the sample prior to metallization and the pretreatment steps therefor; and application of an approximately 2-micron electroless nickel layer. No changes in adhesion were noted.

EXAMPLE 8

The procedure of Example 6 was repeated, using an "Amoco 1999-3" substrate, after which the electroless nickel was overplated with 3.75 microns of silver as described in Example 4. The sample passed the adhesion test with a rating of 5. However, silver overplating following treatment according to Example 1 produced a sample which failed the adhesion test, with a rating of 0.

EXAMPLE 9

Cylindrical tubes, about 2.5×5.0 cm., of the four carbon fiber-reinforced cyanate ester polymers employed in the preceding examples were pretreated as in Example 4 and plated with electrolytic silver on their inner and outer surfaces to a thickness of 3.75 microns, followed by heat treatment. They all passed the adhesion test with a rating of 5. Multiplexers prepared from similarly prepared samples also demonstrated excellent adhesion.

What is claimed is:

1. A method for depositing an adherent metal layer on the surface of a resinous substrate comprising a polymeric cyanate ester, said method comprising the steps in sequence of:
   contacting at least a portion of said surface with an aqueous alkali metal hydroxide solution having a concentration in the range of about 4–15M,
   contacting said surface with a material consisting essentially of aqueous nitric acid of at least about 50% concentration by weight,
   depositing an electroless metal layer on said surface, and
   heat treating the metal-coated surface at a temperature in the range of about 100°–150° C. for at least about 30 minutes.

2. A method according to claim 1, wherein the substrate contains fibrous reinforcement.

3. A method according to claim 2 wherein the fibrous reinforcement comprises carbon fibers.

4. A method according to claim 1 wherein contact with the alkali metal hydroxide solution is at a temperature in the range of about 50°–90° C. and for a period of about 1–4 minutes, and contact with the nitric acid is at a temperature in the range of about 20°–30° C. and for a period of about 1–5 minutes.

5. A method according to claim 1 wherein a water rinse is employed after each aqueous treatment step.

6. A method according to claim 1 wherein the electroless metal layer is nickel.

7. A method for depositing an adherent metal layer on the surface of a resinous substrate comprising a polymeric cyanate ester, said method comprising the steps in sequence of:
   contacting at least a portion of said surface with an aqueous solution consisting essentially of alkali metal permanganate and alkali metal hydroxide in concentrations of about 0.4–2.0M and about 0.5–4.0M, respectively;
   contacting said surface with an aqueous alkali metal hydroxide solution having a concentration in the range of about 4–15M,
   contacting said surface with a material consisting essentially of aqueous nitric acid of at least about 50% concentration by weight,
   depositing an electroless metal layer on said surface, and
   heat treating the metal-coated surface at a temperature in the range of about 100°–150° C. for at least about 30 minutes.

8. A method according to claim 7 wherein contact with the permanganate solution is followed by removal of manganese residues by contact with a reducing agent.

9. A method according to claim 8 wherein the substrate contains fibrous reinforcement.

10. A method according to claim 9 wherein the fibrous reinforcement comprises carbon fibers.

11. A method according to claim 8 wherein:
    contact with the permanganate solution is at a temperature in the range of about 50°–90° C. and for a period of about 2–15 minutes,
    contact with the alkali metal hydroxide solution is at a temperature in the range of about 50°–90° C. and for a period of about 1–4 minutes, and contact with the nitric acid is at a temperature in the range of about 20°–30° C. and for a period of about 1–5 minutes.

12. A method according to claim 8 wherein a water rinse is employed after each aqueous treatment step.

13. A method according to claim 8 wherein the electroless metal layer is nickel.

14. A method for depositing an adherent metal layer on the surface of a resinous substrate comprising a polymeric cyanate ester, said method comprising the steps in sequence of:

contacting at least a portion of said surface with an aqueous alkali metal hydroxide solution having a concentration in the range of about 4–5M;

contacting said surface with an aqueous solution consisting essentially of alkali metal permanganate and alkali metal hydroxide in concentrations of about 0.4–2.0M and about 0.5–4.0M, respectively;

contacting said surface with an aqueous alkali metal hydroxide solution having a concentration in the range of about 4–15M, contacting said surface with a material consisting essentially of aqueous nitric acid of at least about 50% concentration by weight, depositing an electroless metal layer on said surface, and heat treating the metal-coated surface at a temperature in the range of about 100°–150° C. for at least about 30 minutes.

15. A method according to claim 14 wherein contact with the permanganate solution is followed by removal of manganese residues by contact with a reducing agent.

16. A method according to claim 15 wherein the substrate contains fibrous reinforcement.

17. A method according to claim 16 wherein the fibrous reinforcement comprises carbon fibers.

18. A method according to claim 15 wherein:

contact with both alkali metal hydroxide solutions is at a temperature in the range of about 50°–90° C. and for a period of about 1–4 minutes, contact with the permanganate solution is at a temperature in the range of about 50°–90° C. and for a period of about 2–15 minutes, and contact with the nitric acid is at a temperature in the range of about 20°–30° C. and for a period of about 1–5 minutes.

19. A method according to claim 15 wherein a water rinse is employed after each aqueous treatment step.

20. A method according to claim 15 wherein the electroless metal layer is nickel.

* * * * *